US006525337B1

United States Patent
Ugajin et al.

(10) Patent No.: US 6,525,337 B1
(45) Date of Patent: Feb. 25, 2003

(54) LIGHT AND/OR ELECTRON ELEMENT

(75) Inventors: Ryuichi Ugajin, Tokyo (JP); Yoshihiko Kuroki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/786,526

(22) PCT Filed: Jul. 5, 2000

(86) PCT No.: PCT/JP00/04468

§ 371 (c)(1),
(2), (4) Date: Jun. 11, 2001

(87) PCT Pub. No.: WO01/03263

PCT Pub. Date: Jan. 11, 2001

(30) Foreign Application Priority Data

| Jul. 6, 1999 | (JP) | 11-191535 |
| Oct. 20, 1999 | (JP) | 11-298812 |

(51) Int. Cl.[7] .................................. H01L 29/06
(52) U.S. Cl. ........................... 257/14; 257/421
(58) Field of Search ................. 257/14, 421, 13

(56) References Cited

U.S. PATENT DOCUMENTS 6,403,209 B1 * 6/2002 Barton et al. ............ 428/307.7
6,447,879 B1 * 9/2002 Sakurai et al. ............ 428/161

FOREIGN PATENT DOCUMENTS

JP  11-220118  8/1999

OTHER PUBLICATIONS

H. Isshiki, e tal., "GaAs/GaP Atomic Layer Fractal Superlattice grown by Atomic Layer Epitaxy", Technical Research Report of the Institute of Electronics, Information and Communication Engineers, vol. 97, No. 100 (LQE97) (1997), pp. 13–18.

R. Ugajin, "Magneto–optics in a square–well quantum dot", Physical Review B, vol. 53, No. 11 (1996), pp. 6963–6966.

M. Grundmann, et al., "Gain and Threshold of Quantum Dot Lasers: Theory and Comparison to Experiments", Japanese Journal of Applied Physics, vol. 36, Part I, No. 6B (1997), pp. 4181–4187.

* cited by examiner

*Primary Examiner*—Sara Crane
(74) *Attorney, Agent, or Firm*—Sonnenschein, Nath & Rosenthal

(57) ABSTRACT

An optical and/or electronic device is operated by degeneracy of density of states caused by confinement of electrons in a fractal region having a self-similarity. An AlGaAs/GaAs light emitting device is configured by distributing GaAs quantum dots in a fractal arrangement and confining them in i-type AlGaAs. A single-electron state of the quantum dot array exhibits degeneracy of density of states. Further, a strong quantum chaos is generated to bring about degeneracy of density of states by applying a random magnetic field by addition of a magnetic impurity to the region having a self-similarity.

6 Claims, 12 Drawing Sheets

$\alpha = 0, n = 10000$ $\alpha = 1$, n=10000

$\alpha = 2, n = 10000$

Fig. 6

| $\alpha$ | $D_f$ |
|---|---|
| 0.0 | 2.910 |
| 0.2 | 2.897 |
| 0.4 | 2.790 |
| 0.6 | 2.577 |
| 1.0 | 2.450 |
| 2.0 | 2.164 |

LIGHT AND/OR ELECTRON ELEMENT

BACKGROUND OF THE INVENTION

1. Field of the Invention

The present invention relates to an optical and/or electronic device, and more particularly to an optical and/or electronic device based on a novel operating principle.

2. Background Art

Conventional typical semiconductor devices are designed to operate by using electrons or holes near band edges of their conduction band or valence bands. For example, a light emitting device using a compound semiconductor of GaAs, or the like, utilizes emission of light by pair annihilation of electrons at the bottom of the conduction band and holes at the bottom of the valence band. However, state densities at the bottom of the conduction band and the bottom of the valence band are small, and therefore, when laser oscillation is intended, for example, there are limited electrons and holes, and this is one of the factors that impose the upper limit to the quantum efficiency. Needless to say, its reason lies in that electrons are Fermi particles and act on the Pauli exclusion principle.

Recently, nanostructures like quantum wires and quantum dots were made by using heterojunctions of compound semiconductors, and their application to light emitting devices is under discussion. This is because state densities of sub-band edges made by such artificial structures can be increased effectively and the quantum efficiency upon emission of light can be increased.

However, all of such conventional nanostructures were based on periodical structures, and such increase of density of states was limited, accordingly.

It is therefore an object of the present invention to provide an optical and/or electronic device based on a novel operating principle, which releases the limit of the conventional nanostructures and brings about degeneracy of density of states fundamentally.

SUMMARY OF THE INVENTION

The present Inventors made active studies toward solution of the above-mentioned problem, and as a result, reached the conclusion that the problem involved in the conventional techniques would be solved by degeneracy of density of states as a result of confinement of electrons in a region having fractal self-similarity, and not a periodical structure like a super-lattice structure, and reached the present invention.

In order to attain the above-mentioned object, according to a first aspect of the invention, there is provided an optical and/or electronic device characterized in the use of degeneracy of density of states by confinement of electrons or holes in a region having a self-similarity.

In a typical example of the first aspect of the invention, degeneracy of density of states is used for electron transition that follows emission.

According to a second aspect of the invention, there is provided an optical and/or electronic device characterized in the use of degeneracy of density of states by application of a random magnetic field to a region having a self-similarity.

The optical and/or electronic device according to the first aspect of the invention having the above-summarized configuration can generate a lot of electrons or holes equal in energy by using degeneracy of density of states by confinement of electrons or holes in a region having self-similarity, and by using it, the device can be used in various modes such as realization of a light emitting device with a high efficiency.

The optical and/or electronic device according to the second aspect of the invention having the above-summarized configuration can generate an quantum chaos more intensive than conventional devices by applying a random magnetic field to a region having self-similarity, through this process, can realize higher degeneracy of density of states, and by using it, can realize an optical and/or electronic device with a high efficiency.

BRIEF DESCRIPTION OF THE DRAWINGS

FIG. 6 is a schematic diagram that shows fractal dimensions $D_f$ obtained for the parameter α.

DETAILED DESCRIPTION OF THE PRESENTLY PREFERRED EMBODIMENTS

Figure 1:
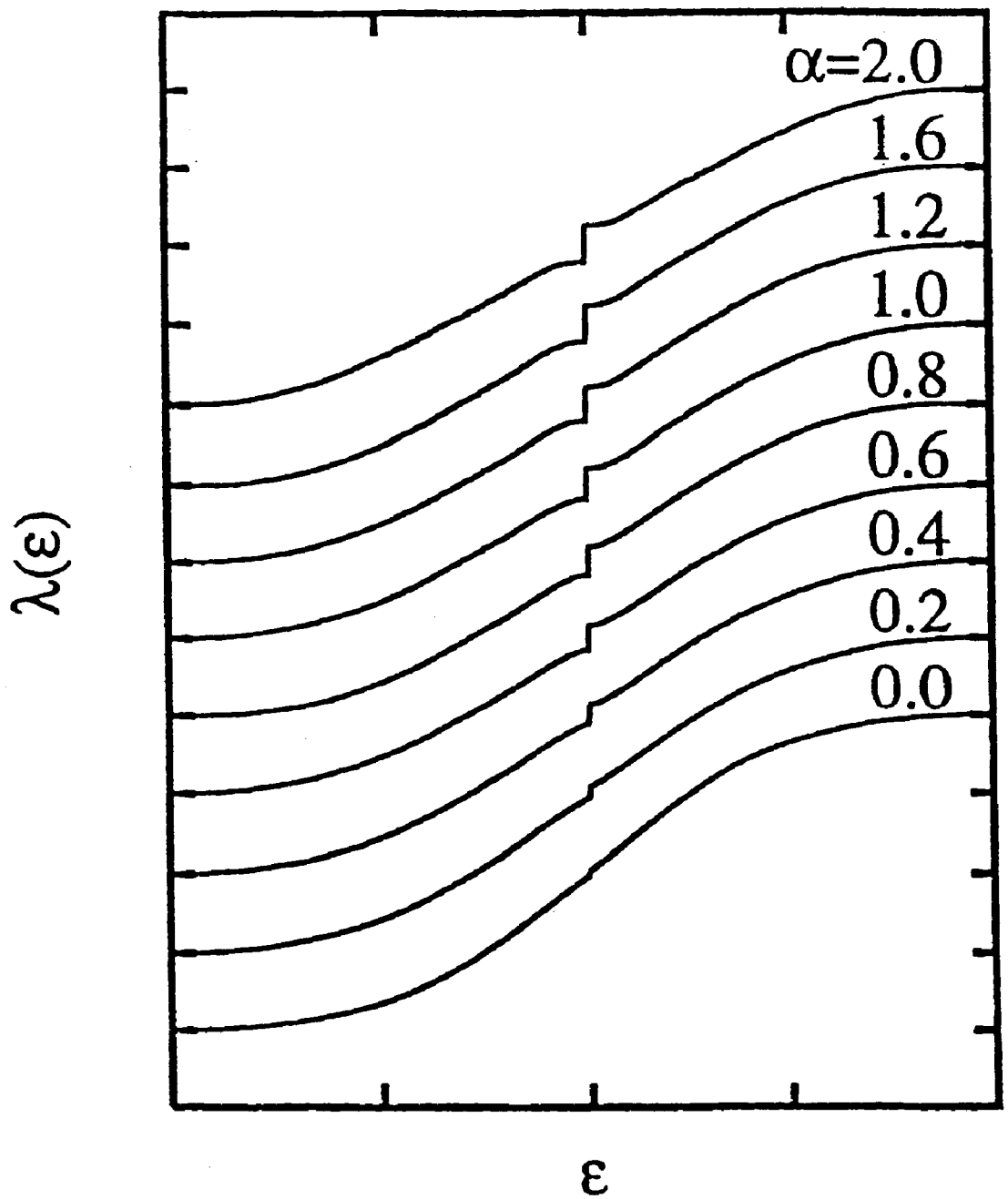
FIG. 1 is a schematic diagram that shows integrals of state densities as functions of energies.

Explained below are embodiments of the invention with reference to the drawings.

An explanation is presented below concerning the results of numerical analysis conducted by the present Inventors. First, a fractal figure having a tree-like structure by a dielectric breakdown model is described (See L. Niemeyer, L. Pietronero, H. J. Wiesmann, Phys. Rev. Lett. 52, 1033 (1984)). Then, electron states on the fractal figure are analyzed.

(A) Dielectric Breakdown Model

A three-dimensional lattice S is defined, and a scalar potential field $\phi(i_1, i_2, i_3)$ on a lattice site $(i_1, i_2, i_3) \in S$. This is called an electric potential. Let this electric potential follow a Laplace equation:

$$\Delta\phi(i_1, i_2, i_3)=0 \tag{1}$$

The figure $T_n$ defined therefrom is a set of lattice sites on a three-dimensional [three-dimensional] lattice. $T_0$ consists of (0, 0, 0) alone, $T_{n+1}$ is created by sequentially adding one lattice site to $T_n$ by the following rule.

Let the electric potential of each point contained in $T_n$ be 1 and the electric potential at a point at infinity be 0. That is, $$\phi(i_1, i_2, i_3)=0 \text{ when } (i_1, i_2, i_3) \to \infty \quad (2)$$

$$\phi(i_1, i_2, i_3)=1 \text{ when } (i_1, i_2, i_3) \in T_n \quad (3)$$

Equation (1) is solved under that boundary condition, and electric potential of each lattice site is determined. The lattice site to be added to $T_n$ to form $T_{n+1}$ is not included in $T_n$, and it is selected from a set $U_n$ of lattice sites closest to $T_n$. The number of lattice sites contained in $U_n$ is written as $N_n$.

For each site contained in $U_n(i_{1,m}, i_{2,m}, i_{3,m})$ (where $m=1, 2, \ldots, N_n$), its electric field intensity is defined as $$E_m(\alpha) = |\phi(i_{1,m}, i_{2,m}, i_{3,m}) - 1|^\alpha \quad (4)$$

The probability that a site $(i_{1,m}, i_{2,m}, i_{3,m})$ in $U_n$ is proportional to its electric field intensity $E_m(\alpha)$. That is, the probability is:

$$p_m(\alpha) = \frac{E_m(\alpha)}{\sum_{j=1}^{N_n} E_j(\alpha)} \quad (5)$$

By repeating the above operation, $T_n$ is formed progressively. An ideal fractal will be the infinitely repeated limit set:

$$T_\infty = \lim_{n \to \infty} T_n \quad (6)$$

In case of $\alpha=1$, the above coincides with the result of generation of a figure by diffusion limited aggregation (See T. A. Written, Jr. and L. M. Sander, Phys. Rev. Lett. 47, 1400(1984)); Phys. Rev. B 27, 5686(1983)).

(B) Electron System on the Fractal

Let a quantum system of one particle be defined on the fractal defined in (A). A lattice site:

$$r_p = (i_{1,p}, i_{2,p}, i_{3,p}) \in T_n \quad (7)$$

where, $m=1, 2, \ldots, n+1$, which is an element of $T_n$ is taken. An operand $\hat{c}_p^+$ for creating a quantum at the lattice site $r_p \in T_n$ is defined. Of course, here is an anticommutation relation:

$$\{\hat{c}_p, \hat{c}_q^+\} = \delta_{p,q} \quad (8)$$

Then, the Hamiltonian $\hat{H}$ of the quantum system is defined as:

$$\hat{H} = -\sum_{p,q} t_{p,q} \hat{c}_p^+ \hat{c}_q \quad (9)$$

As the transfer $t_{p,q}$, $$t_{p,q} = \begin{cases} 1 & \text{when } |r_p - r_q| = 1 \\ 0 & \text{otherwise} \end{cases} \quad (10)$$

is a natural model. That is, hopping is possible only between closest sites.

When the eigenenergy of the Hamiltonian $\hat{H}$ is $\epsilon_m$ and the eigenvector is $|m\rangle$, then $$\hat{H}|m\rangle = \epsilon_m |m\rangle \quad (11)$$

where $m=0, 1, 2, \ldots, n$.

First, n+1 quanta $\epsilon_m$ are normalized such that distances of their closest levels become 1 on average. That is, $$\omega_j = \epsilon_j - \epsilon_{j-1} \quad (12)$$

However, when $j=1, 2, \ldots, n$, by using $$\bar{\omega} = \frac{1}{n} \sum_{j=1}^{n} \omega_j \quad (13)$$

they are converted to new levels $$\varepsilon_0 = 0 \quad (14)$$

$$\varepsilon_m = \frac{1}{\bar{\omega}} \sum_{j=1}^{m} \omega_j = \sum_{j=1}^{m} \Omega_j \quad (15)$$

Here, $$\Omega_j = \frac{\omega_j}{\bar{\omega}} \quad (16)$$

The density of states of the system is defined by $$\rho(\varepsilon) = \frac{1}{n+1} \sum_{m=1}^{n+1} \delta(\varepsilon - \varepsilon_m) \quad (17)$$

and its integral (the staircase function)

$$\lambda(\varepsilon) = \int_{-\infty}^{\varepsilon} d\eta \rho(\eta) \quad (18)$$

is calculated.

Then, the staircase function obtained by fractal growth of the number of sites being n=10000 while changing $\alpha$ from 0 to 2 is shown in FIG. 1 as a function of energy $\epsilon$. It will be appreciated from FIG. 1 that as $\alpha$ increases, hopping of $\lambda(\epsilon)$ appears in the center of the band, and the density of states at that energy increases due to degeneracy.

Figure 2:
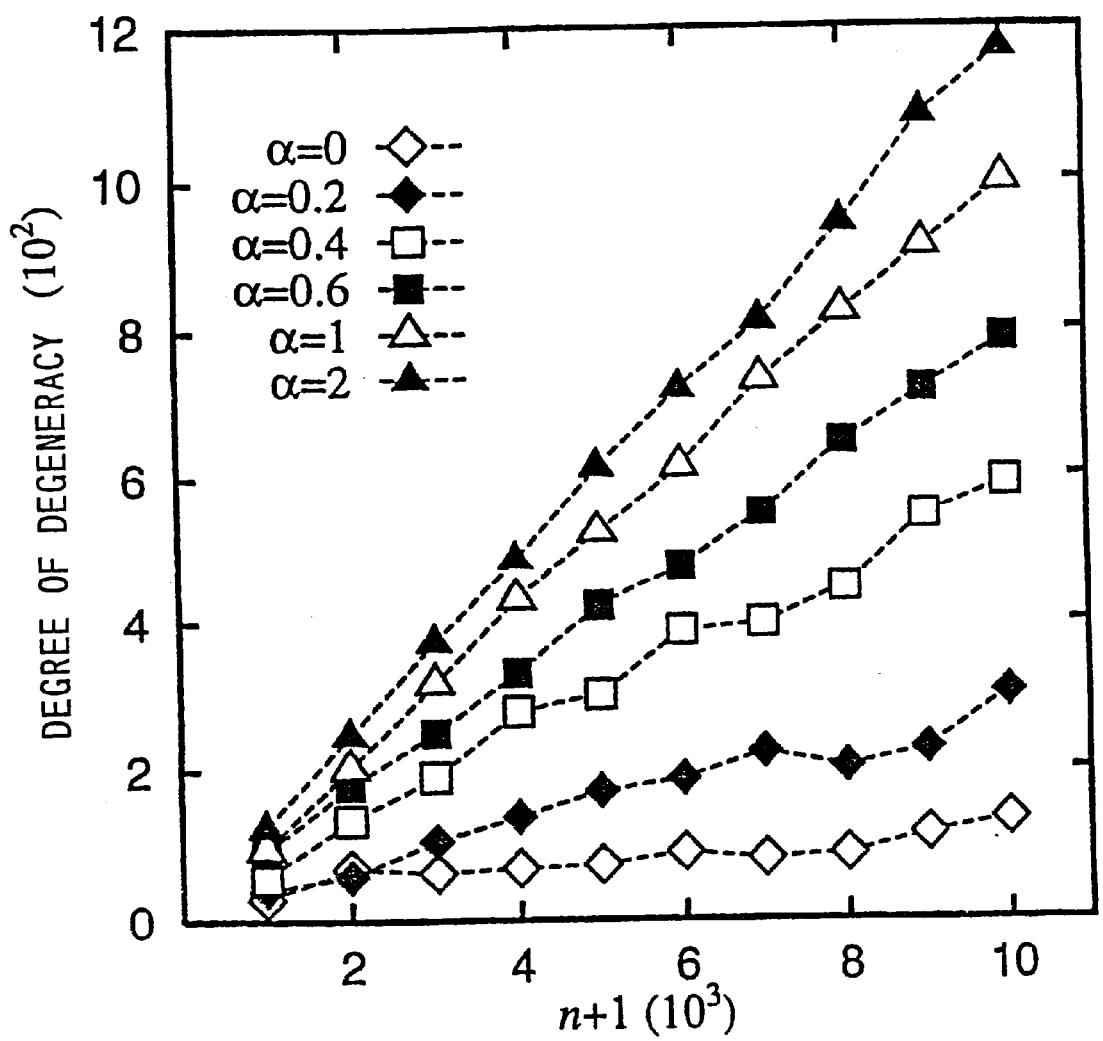
FIG. 2 is a schematic diagram in which degrees of degeneracy of density of states are plotted while changing the number of sites.

FIG. 2 is a diagram in which degrees of degeneracy of density of states are plotted while changing n. It will be appreciated from FIG. 2 that the degree of degeneracy increases linearly with n when $\alpha \gg 0$.

When significantly large degeneracy occurs in the band center of the single-electron state as mentioned above, and electrons are progressively packed from the ground state, a number of electrons equal in energy are generated. Since similar degeneracy occurs also regarding holes, upon pair annihilation of electrons of the degenerate energy and holes of a degenerate energy, light with a uniform wavelength is emitted. Therefore, substances obtained by fractal growth can be used in opto-electric devices as efficient light emitting materials.

Various materials with such fractal structures are known. For example, tracheas of lungs also have a self-similarity (J. H. Comroe, Scientific American 214, 56(February 1966)). Further, tree-like structures are fabricated by using succino-nitrile materials (J. C. LaCombe, M. B. Koss, V. E. Fradkov, M. E. Glicksman, Phys. Reve. E 52, 2778(1995), A. Ludwig, Phys. Rev. E. 59, 1893(1999)). Further, they exist also in cranial nerve networks (for example, J. C. Eccles, "How the self controls its brain" (Springer-Verlag, Berlin Heidelberg, 1994)).

On the other hand, regarding quantum systems having fractal structures, it is known that degeneracy of density of states derived from their self-similarity exists, and they themselves are useful. However, the quantum chaos the system exhibited was regulated by the GOE (Gaussian orthogonal ensemble) distribution, and it was a relatively weak quantum chaos. According to the present Inventors' research, by introducing a random magnetic field, it is possible to reconcile realization of a system exhibiting a stronger quantum chaos by an effect of the magnetic field and the self-similarity the fractal structure has. Such a random magnetic field can be realized by introducing a magnetic impurity into a fractal coupled structure.

A fractal coupled structure added with a magnetic impurity for realizing this self-similar strongly-coupled quantum chaos will be explained below in detail.

The fractal coupled structure is made by creating a fractal and defining an electronic system thereon as explained below.

(C) Creation of a Fractal

Figure 3:
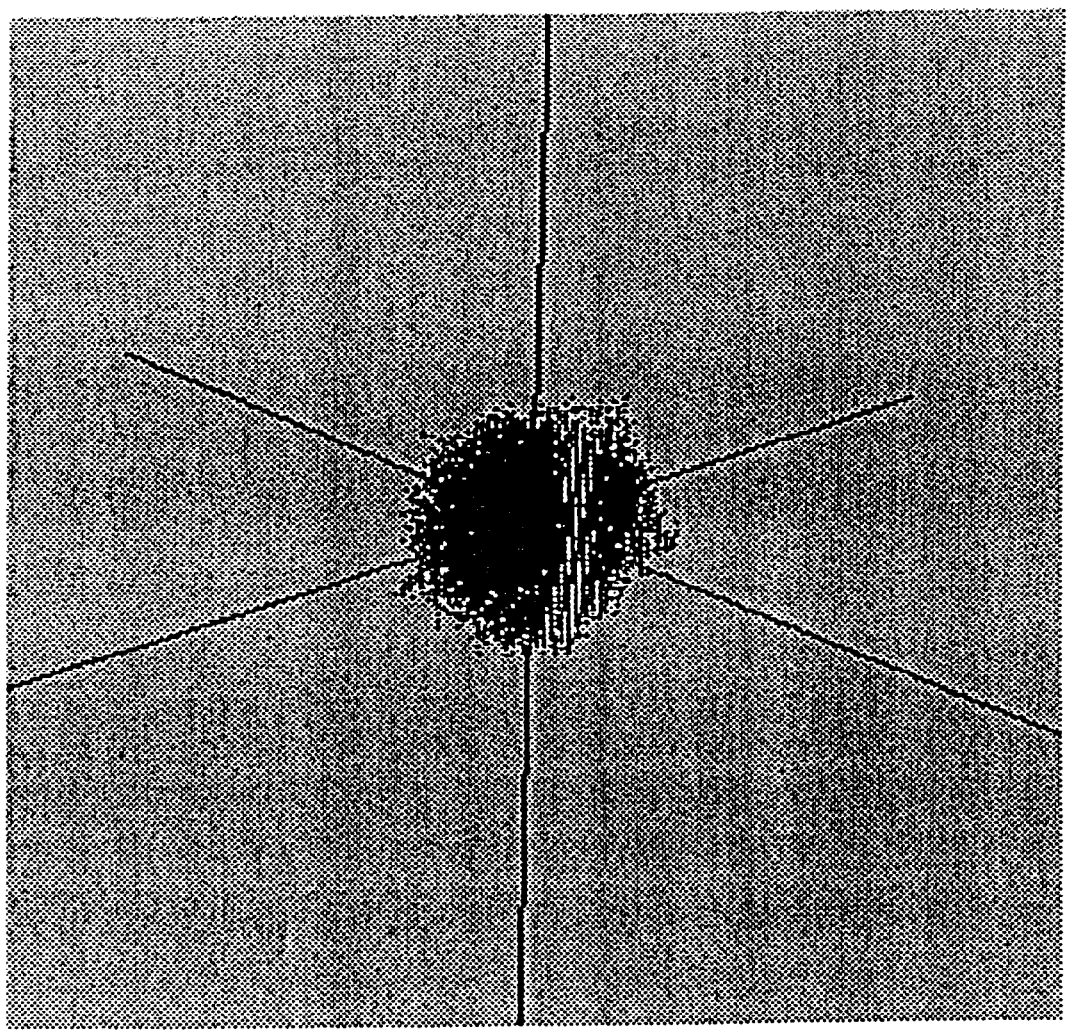
FIG. 3 is a schematic diagram that shows a tree-like fractal obtained by fractal growth of n=10000 when α=0.
Figure 4:
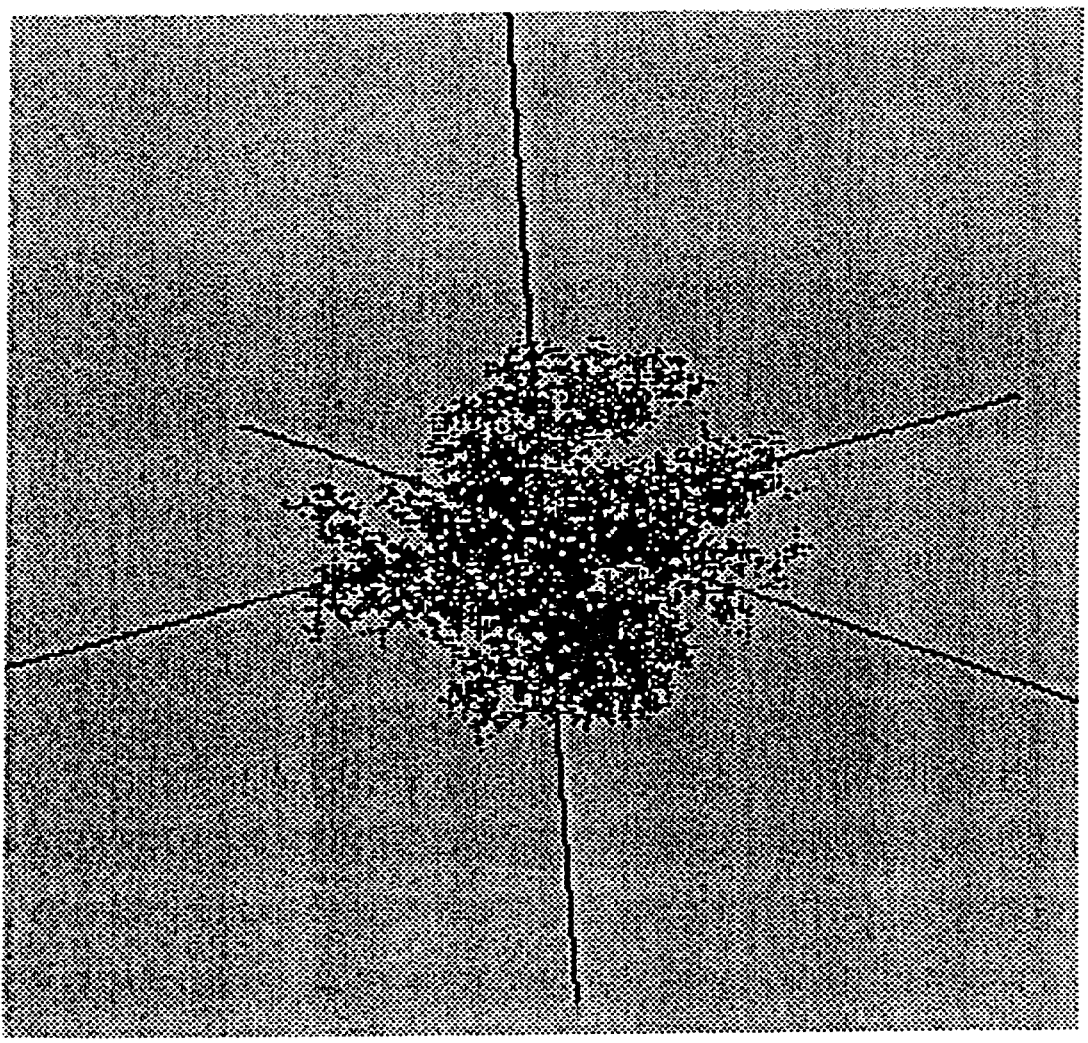
FIG. 4 is a schematic diagram that shows a tree-like fractal obtained by fractal growth of n=10000 when α=1.
Figure 5:
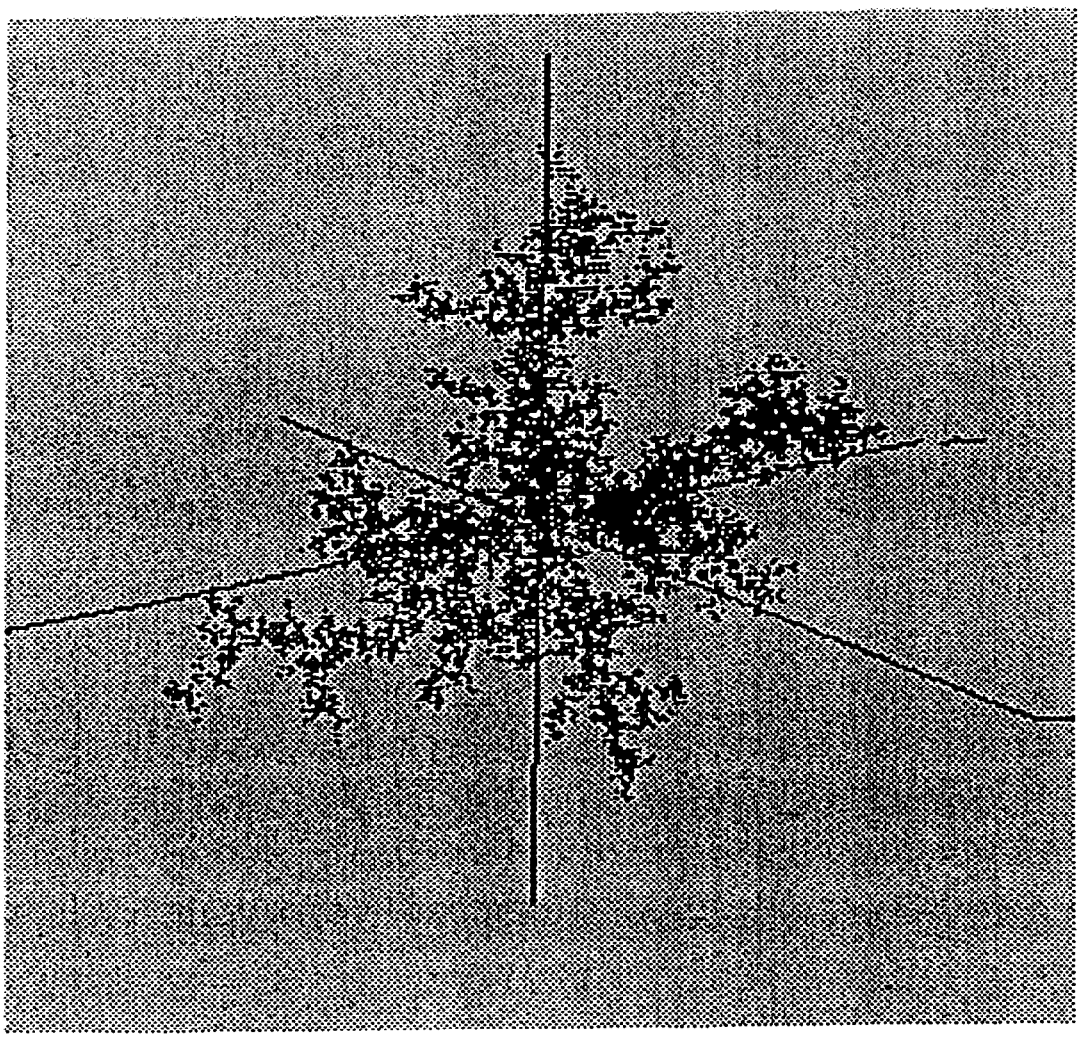
FIG. 5 is a schematic diagram that shows a tree-like fractal obtained by fractal growth of n=10000 when α=2.

A fractal is created in the same manner as explained in (A). Tree-like fractals obtained by fractal growth of n=10000 under α=0, 1, 2 are shown in FIGS. 3, 4 and 5. FIG. 3 shows a fractal under α=0, FIG. 4 shows a fractal under α=1, and FIG. 5 shows a fractal under α=2. Fractal dimensions $D_f$ of fractal figures obtained by numerical simulation for various values of α are collectively shown in FIG. 6.

(D) Electronic System of a Fractal

Let a quantum system of one particle be defined on a fractal defined in (C). Here is taken the lattice site $$r_p = (i_{1,p}, i_{2,p}, i_{3,p}) \in T_n \tag{19}$$

where p=1, 2, . . . , n+1 which is an element of $T_n$. An operand $\hat{c}_p^+$ for creating a quantum at the lattice site $r_p \in T_n$ is defined. Of course, here is an anticommutation relation:

$$\{\hat{c}_p, \hat{c}_q^+\} = \delta_{p,q} \tag{20}$$

Then, the Hamiltonian $\hat{H}$ of the quantum system is defined as:

$$\hat{H}_n = -\sum_{p,q} t_{p,q} \hat{c}_p^+ \hat{c}_q \tag{21}$$

As the transfer $t_{q,p}$, here is adopted $$t_{p,q} = \begin{cases} \exp(i\theta_{p,q}) & \text{when } |r_p - r_q| = 1 \\ 0 & \text{otherwise} \end{cases} \tag{22}$$

where $\theta_{p,q} = \theta_{q,p}$ is a random real number that satisfies $$0 < \theta_{p,q} < 2\pi r \tag{23}$$

The width of fluctuation is adjusted by r. In this mode, hopping is possible only between closest sites. In response to the hopping, the random phase factor $\theta_{p,q}$ is added depending on the location. If this phase factor is integrated along a loop making one round of the lattice site, a magnetic flux penetrating the loop is obtained. This means a magnetic field is locally introduced to the random distribution of $0 < \theta_{p,q} < 2\pi r$. This magnetic field is absolutely random in intensity and direction, and it is a zero magnetic field in its spatial average, and never destroys the fractal property of the system. The self-similarity of the tree-like fractal discussed here may be formed originally through a random process, and exists within the range of the spatial average. Since the above-mentioned random magnetic field disappears when the spatial average is taken, it does not break the self-similarity of the tree-like fractal. Degeneracy of density of states derived from the self-similarity is not broken by the random magnetic field. When r=0, it results in a model in which no random magnetic field exists.

When the eigenenergy of the Hamiltonian $\hat{H}$ is $\epsilon_m$ and the eigenvector is $|m>$, then $$\hat{H}|m> = \epsilon_m|m> \tag{24}$$

where m=0, 1, 2, . . . , n.

First, n+1 quantum levels $\gamma_m$ are normalized such that distances of their closest levels become 1 in average. That is, $$\omega_j = \epsilon_j - \epsilon_{j-1} \tag{25}$$

However, when j=1, 2, . . . , n, by using $$\overline{\omega} = \frac{1}{n} \sum_{j=1}^{n} \omega_j \tag{26}$$

they are converted to new levels $$\epsilon_0 = 0 \tag{27}$$

$$\varepsilon_m = \frac{1}{\overline{\omega}} \sum_{j=1}^{m} \omega_j = \sum_{j=1}^{m} \Omega_j \tag{28}$$

Here, $$\Omega_j = \frac{\omega_j}{\overline{\omega}} \tag{29}$$

The density of states of the system is defined by $$\rho(\varepsilon) = \frac{1}{n+1} \sum_{m=1}^{n+1} \delta(\varepsilon - \varepsilon_m) \tag{30}$$

and its integral (the staircase function)

$$\lambda(\varepsilon) = \int_{-\infty}^{\infty} d\eta \rho(\eta) \tag{31}$$

is calculated. The staircase function obtained is converted by a procedure called unfolding such that the density of states becomes constant on average. By using quantum levels obtained in this manner, closest inter-level distance distribution P(s) and $\Delta_3$ statistic amounts of Dyson and Mehta are computed. As taught in references (L. E. Reichl, The transition to chaos: in conservative classical systems: quantum manifestations (Springer, N.Y., 1992) and F. Haake, Quantum Signatures of chaos, (Springer-Verlag, 1991)), by using these statistic amounts, it can be detected whether there is generated a quantum chaos. It is also known that quantum chaos systems are sensitive to external perturbation similar to classical chaos systems, and analysis of quantum chaos is important as an index for designing non-linear materials.

In case of an integrable system, closest inter-level distance distribution P(s) and $\Delta_3$ statistic amount become Poisson distributions $$P_P(s) = e^{-s} \tag{32}$$

$$\Delta_3(n) = \frac{n}{15} \tag{33}$$

and in a system following the GOE distribution that is the weakest quantum chaos, they becomes $$P_{GOE}(s) = \frac{\pi s}{2} e^{-\pi s^2/4} \tag{34}$$

$$\Delta_3(n) = \frac{1}{\pi^2}\left[\log(2\pi n) + \gamma - \frac{\pi^2}{8} - \frac{5}{4}\right] + O(s^{-1}) \tag{35}$$

Figure 7:
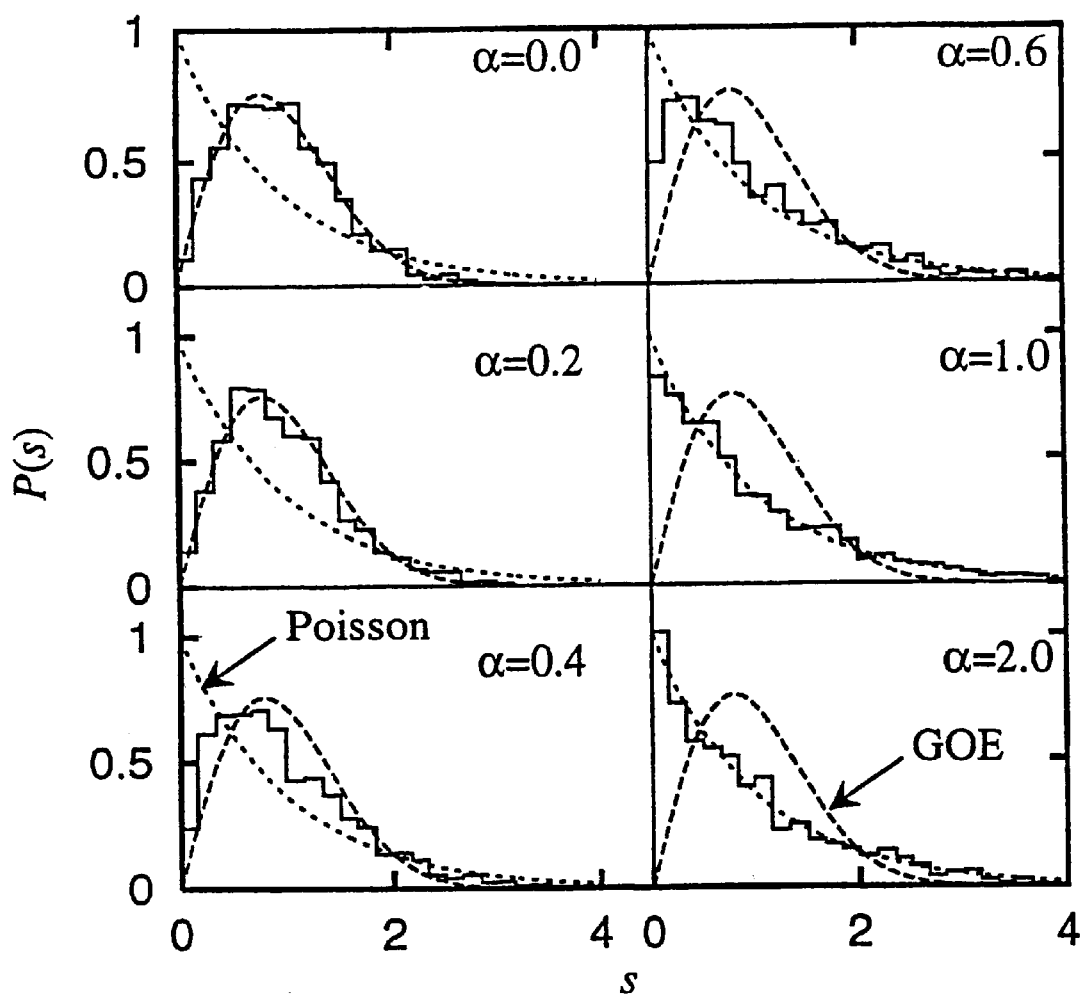
FIG. 7 is a schematic diagram that shows quantum level statics when r=0.
Figure 8:
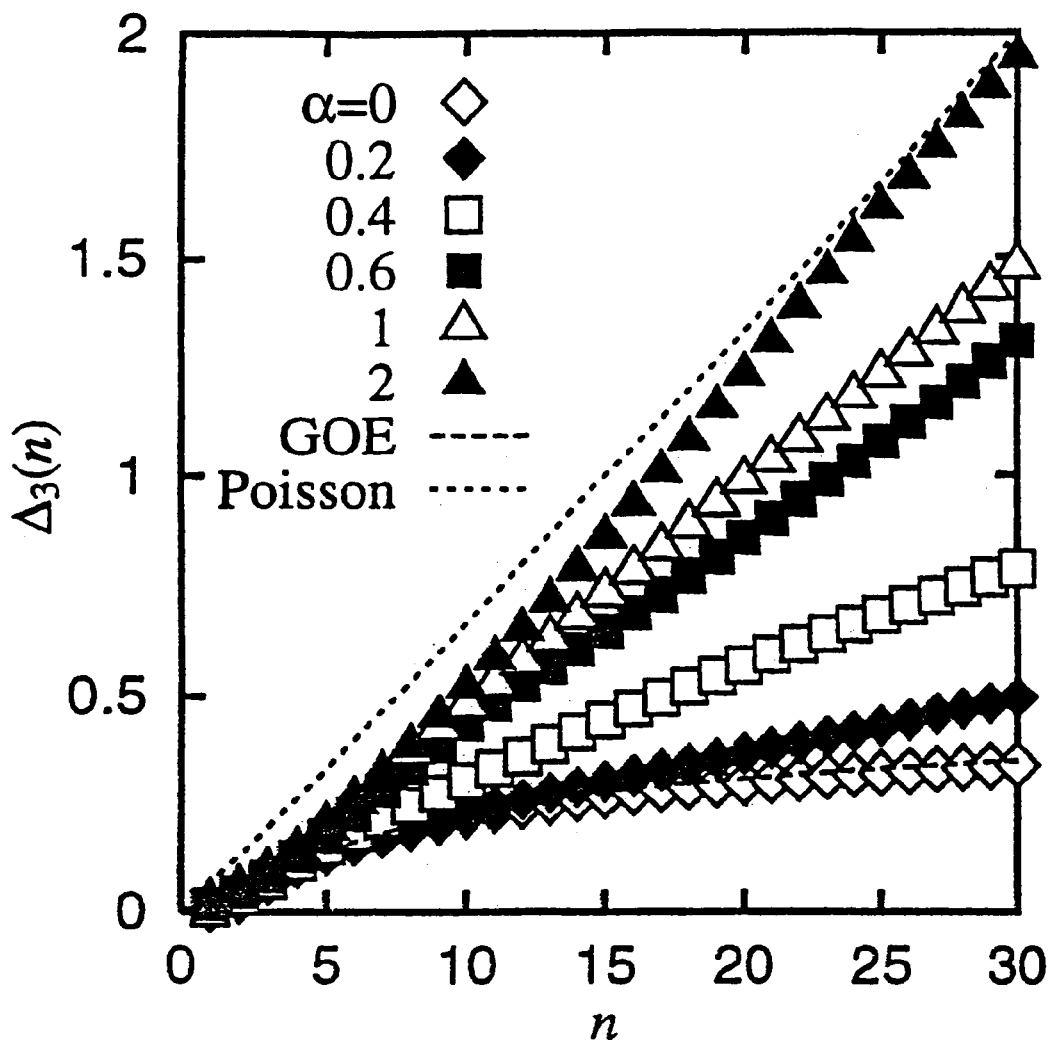
FIG. 8 is a schematic diagram that shows quantum level statics when r=0.

In the above equation, $\gamma$ is the Euler's constant. In FIGS. 7 and 8, quantum level statistics in case of r=0 are shown. As $\alpha$ decreases, Poisson distribution changes to GOE distribution. In a tree-like fractal without magnetic impurity, the quantum chaos appearing upon $\alpha$ being small is characterized by GOE distribution. Attention is called to the region of s~0 of P(s). In case of an integrable system, P(s)~1. In case of GOE distribution, P(s) s. In the region of s~0, probability of existence of level distance is proportional to the primary of the energy difference s.

Figure 9:
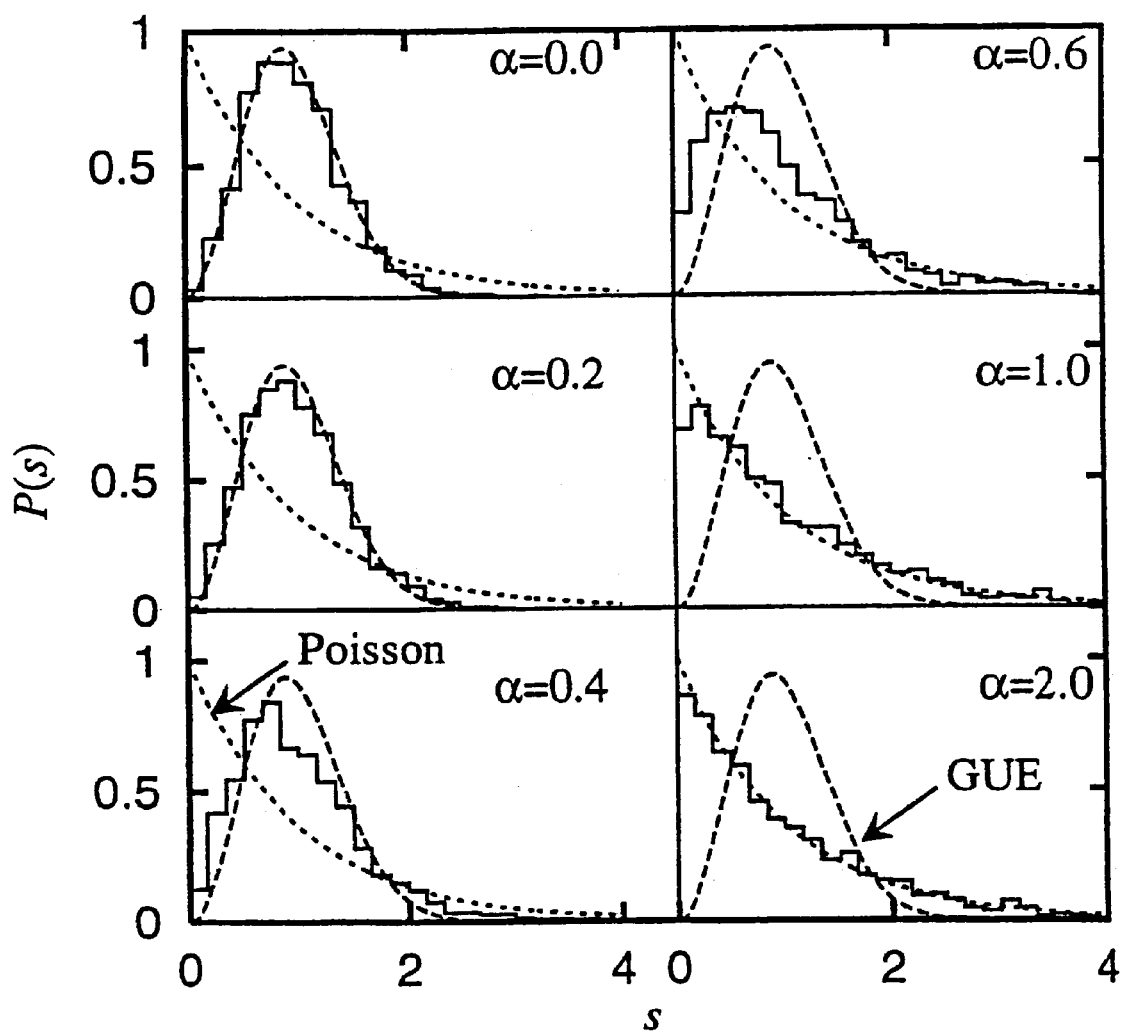
FIG. 9 is a schematic diagram that shows quantum level statics when r=1.
Figure 10:
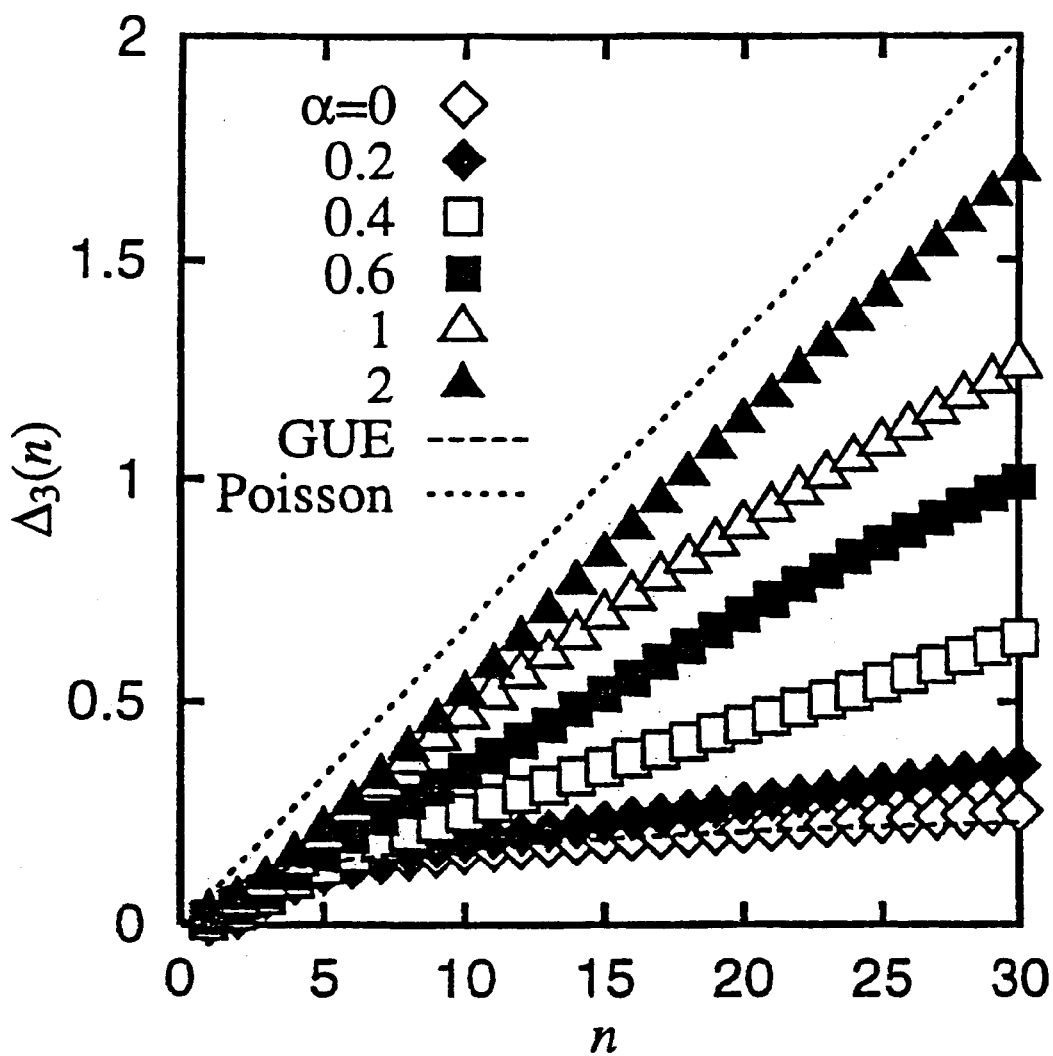
FIG. 10 is a schematic diagram that shows quantum level statics when r=1.

On the other hand, in case of a tree-like fractal caused by magnetic impurities, r=1 is shown FIGS. 9 and 10. As $\alpha$ decreases, Poisson distribution changes to GUE (Gaussian unitary ensemble) distribution. In this GUE distribution, $$P_{GUE}(s) = \frac{32s^2}{\pi^2} e^{-4s^2/\pi} \tag{36}$$

$$\Delta_3(n) = \frac{1}{2\pi^2}\left[\log(2\pi n) + \gamma - \frac{5}{4}\right] + O(s^{-1}) \tag{37}$$

and in the region of s~0, P(s) s$^2$. That is, the value of P(s) is suppressed stronger. It is appreciated that by introducing magnetic impurities, a quantum chaos stronger than that characterized by GUE distribution is brought about.

Through generation of such a strong quantum chaos, Anderson transition can be controlled in a fractal coupled structure added with magnetic impurities, and degeneracy of density of states with a higher quantum effect can be realized.

Examples of fractal combined structures added with magnetic impurities are those prepared by doping Mn as a magnetic impurity into fractal coupled structures made of Cu, those prepared by doping Mn as a magnetic impurity into fractal coupled structures made of GaAs, and so on. Magnetic impurities to be doped are usually selected such that their impurity levels do not overlap bulk quantum levels.

Figure 11A:
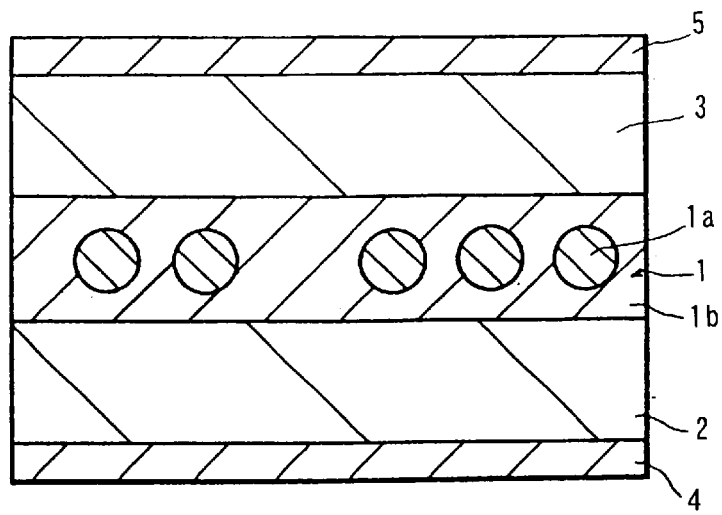
FIG. 11 is a cross-sectional view and a plan view shat show a light emitting device according to the first embodiment of the invention.
Figure 11B:
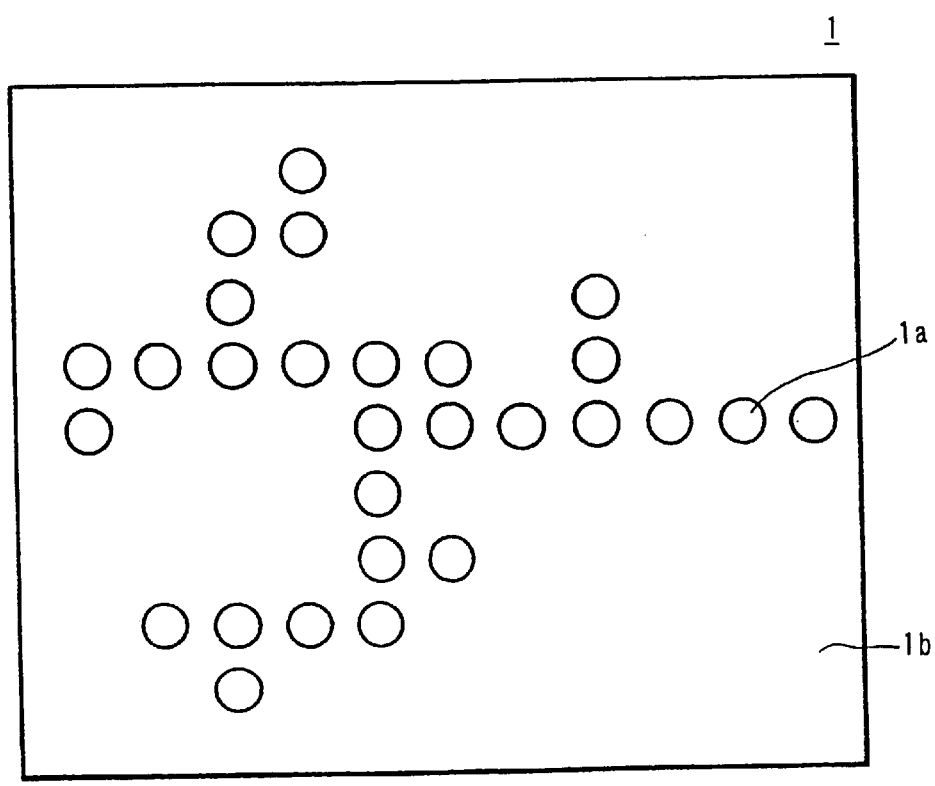

FIG. 11 shows a light emitting device according to the first embodiment of the invention. FIG. 11A is its cross-sectional view, and FIG. 11B is a plan view that shows the active layer of the light emitting device.

As shown in FIG. 11, the light emitting device according to the first embodiment is configured to sandwich the active layer 1 between a p-type AlAs, cladding: layer 2 and an n-type, AlAs cladding layer 3. A p-side electrode 4 is in contact with the p-type AlAs cladding layer 2, and an n-side electrode 5 is in contact with the n-type AlAs cladding layer 3.

The active layer 1 is configured to locate GaAs quantum dots 1a of 1-type GaAs in a fractal arrangement and confine them in an i-type AlGaAs layer 1b. The quantum dot array of those GaAs quantum dots 1a is allowed for tunneling of electrons between closest quantum dots. The single-electron state of this quantum dot array exhibits degeneracy of density of states clarified by the present Inventors.

As explained above, according to the light emitting device following the first embodiment, since the active layer 1 is made of a fractal-like substance, degeneracy of density of states of the fractal-like substance can be used for transition of electrons upon emission of light in the active layer 1, and a light emitting device with a much higher efficiency than conventional devices can be realized.

Figure 12A:
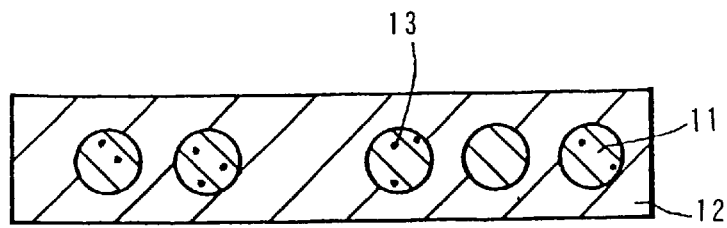
FIG. 12 is a cross-sectional view and a plan view that show an electronic device according to the second embodiment of the invention.
Figure 12B:
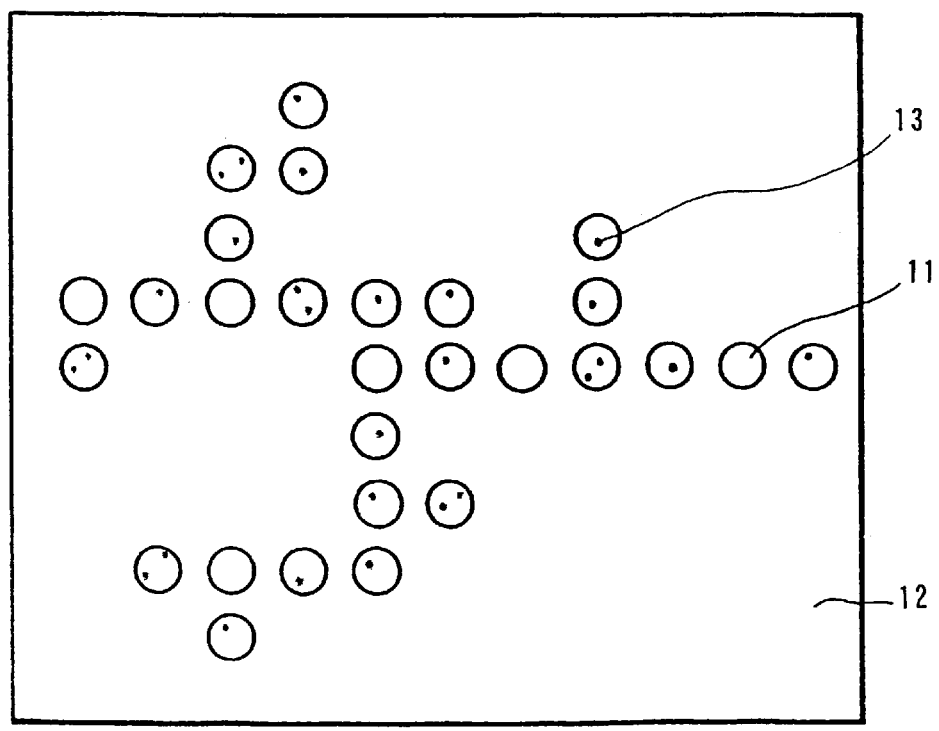

FIG. 12 shows an electronic device according to the second embodiment of the invention. FIG. 12A is its cross-sectional view, and FIG. 12B is a plan view.

As shown in FIG. 12, the electronic device according to the second embodiment has a structure in which GaAs quantum dots 11 are disposed in a fractal arrangement and they are confined in i-type AlGaAs 12. The quantum dot array of those GaAs quantum dots 11 is allowed tunneling of electrons between closest quantum dots. In this case, Mn atoms 13 are added as a magnetic impurity to the GaAs quantum dots 11 forming the quantum dot array, and a random magnetic field is applied by the Mn atoms 13.

Addition of Mn atoms 13 to the GaAs quantum dots 11 may be carried out as follows. That is, for example, after i-type AlGaAs 12 is grown to a predetermined thickness on a substrate, not shown, a Mn-added GaAs layer is grown to a predetermined thickness. After that, this Mn-added GaAs layer is patterned into a predetermined geometry by etching thereby to make the GaAs quantum dots 11. At that time, distribution of Mn atoms 12 in the GaAs quantum dots 11 is determined by distribution of Mn atoms 12 introduced upon growth of the Mn-added GaAs layer.

According to the electronic device following the second embodiment, since Mn atoms 13 are added to GaAs quantum dots 11 forming the quantum dot array, a stronger quantum chaos than that characterized by GUE distribution can be generated by application of a random magnetic field by Mn atoms 13. Then, through the process of generating the strong quantum chaos, high degeneracy of density of states can be realized, and this can be used to realize an electronic device having a much higher efficiency than conventional devices.

Heretofore, specific embodiments of the present invention have been explained. The present invention, however, is not limited to these embodiments, but can be changed .and modified in various embodiments not departing from the technical concept of the present invention.

As described above, according to the present invention, by using degeneracy of density of states resulting from confinement of electrons. or holes in a region having a self-similarity, various applications, such as realization of highly efficient light emitting devices, are possible.

Additionally, according to the present invention, a quantum chaos stronger than a conventional one can be generated by applying a random magnetic field to a region having a self-similarity, and through this process, higher degeneracy of density of states can be realized and can be used to realize highly efficient optical and/or electronic devices.

What is claimed:

1. An optical and/or electronic device, comprising:
   a region having degenerate density of states, wherein said degenerate density of states comprises a self-similarity formed by confinement of at least one of electrons and holes in the region.

2. The optical and/or electronic device according to claim 1, wherein electrons in said region are transitioned following emission of light in said degenerate density of states.

3. An optical and/or electronic device, comprising:
   a region having degenerate density of states, wherein said degenerate density of states comprises a self-similarity formed by application of a random magnetic field to the region.

4. The optical and/or electronic device according to claim 3, wherein said random magnetic field is applied by adding a magnetic impurity to a matrix material.

5. The optical and/or electronic device according to claim 3, wherein said degenerate density of states further comprises a strong quantum chaos state.

6. A method of using an optical and/or electronic device, comprising the steps of:
   emitting light in a region, wherein the region comprises a fractal-like substance; and
   using degeneracy of density of states of the fractal-like substance for transition of electrons upon emission of light.

* * * * *